(12) United States Patent
Jonczyk et al.

(10) Patent No.: US 9,419,167 B2
(45) Date of Patent: Aug. 16, 2016

(54) MAKING SEMICONDUCTOR BODIES FROM MOLTEN MATERIAL USING A FREE-STANDING INTERPOSER SHEET

(75) Inventors: Ralf Jonczyk, Concord, MA (US); Emanuel M. Sachs, Newton, MA (US)

(73) Assignee: 1366 Technologies, Inc., Bedford, MA (US)

( * ) Notice: Subject to any disclaimer, the term of this patent is extended or adjusted under 35 U.S.C. 154(b) by 185 days.

(21) Appl. No.: 13/990,498

(22) PCT Filed: Dec. 1, 2011

(86) PCT No.: PCT/US2011/062914
§ 371 (c)(1),
(2), (4) Date: Oct. 7, 2013

(87) PCT Pub. No.: WO2012/075306
PCT Pub. Date: Jun. 7, 2012

(65) Prior Publication Data
US 2014/0113156 A1    Apr. 24, 2014

Related U.S. Application Data

(60) Provisional application No. 61/418,699, filed on Dec. 1, 2010.

(51) Int. Cl.
*C30B 29/06* (2006.01)
*C30B 28/10* (2006.01)
(Continued)

(52) U.S. Cl.
CPC .......... *H01L 31/182* (2013.01); *C04B 41/4539* (2013.01); *C04B 41/5096* (2013.01);
(Continued)

(58) Field of Classification Search
CPC .................. H01L 21/02625; H01L 21/6838
See application file for complete search history.

(56) References Cited

U.S. PATENT DOCUMENTS

| 3,903,841 A | 9/1975 | Peters |
| 4,777,153 A | 10/1988 | Sonuparlak et al. |
| 2008/0196209 A1* | 8/2008 | Friestad ............... 23/295 R |

FOREIGN PATENT DOCUMENTS

| JP | 2001-121413 | 5/2001 |
| JP | 2003-054932 | 2/2003 |
| WO | 01/77036 A1 | 10/2001 |
| WO | 2010/104838 A1 | 9/2010 |

OTHER PUBLICATIONS

International Search Report and Written Opinion of the International Searching Authority mailed May 29, 2013 for PCT/US2011/062914 to which the present application claims priority.
(Continued)

*Primary Examiner* — Victor A Mandala
*Assistant Examiner* — Regan J Rundio
(74) *Attorney, Agent, or Firm* — Steven J. Weissburg, Esquire

(57) ABSTRACT

An interposer sheet can be used for making semiconductor bodies, such as of silicon, such as for solar cell use. It is free-standing, very thin, flexible, porous and able to withstand the chemical and thermal environment of molten semiconductor without degradation. It is typically of a ceramic material, such as silica, silicon nitride, silicon oxynitride, silicon oxycarbide, silicon carbide, silicon carbonitride, silicon oxycarbonitride and others. It is provided between a forming surface of a mold sheet, and the molten material from which a semiconductor body will be formed. It may be secured to the forming surface or deposited upon the melt. The interposer sheet suppresses grain nucleation, and limits heat flow from the melt. It promotes separation of the semiconductor body from the forming surface. It can be fabricated before its use. Because free-standing and not adhered to the forming surface, problems of mismatch of CTE are minimized. The interposer sheet and semiconductor body are free to expand and contract relatively independently of the forming surface.

14 Claims, 7 Drawing Sheets

(51) Int. Cl.
*H01L 21/20* (2006.01)
*C30B 11/00* (2006.01)
*H01L 31/18* (2006.01)
*H01L 21/02* (2006.01)
*C04B 41/50* (2006.01)
*C04B 41/45* (2006.01)
*C30B 15/00* (2006.01)
*C30B 15/32* (2006.01)
*C30B 21/06* (2006.01)

(52) U.S. Cl.
CPC ............ *C30B11/002* (2013.01); *C30B 29/06* (2013.01); *H01L 21/02002* (2013.01); *H01L 21/02532* (2013.01); *H01L 31/1804* (2013.01); *C30B 15/00* (2013.01); *C30B 15/007* (2013.01); *C30B 15/32* (2013.01); *Y02E 10/546* (2013.01); *Y02P 70/521* (2015.11)

(56) References Cited

OTHER PUBLICATIONS

EPO Communication and Supplementary Search Report mailed Jun. 5, 2014. The European Patent Application No. 11845655.7 claims priority to PCT/US2011/062914 to which the present application claims priority.

Written Opinion from the Intellectual Property Office of Singapore mailed Mar. 12, 2014. The Singapore Patent Application No. 2013037254 claims priority to PCT/US2011/062914 to which the present application claims priority.

Search Report from the Intellectual Property Office of Singapore mailed Mar. 5, 2014. The Singapore Patent Application No. 2013037254 claims priority to PCT/US2011/062914 to which the present application claims priority.

\* cited by examiner

MAKING SEMICONDUCTOR BODIES FROM MOLTEN MATERIAL USING A FREE-STANDING INTERPOSER SHEET

This claims priority to U.S. Provisional application No. 61/418,699, THIN CERAMIC BODIES FOR USE MAKING THIN SEMICONDUCTOR BODIES FROM MOLTEN MATERIAL AND METHODS OF USING SUCH CERAMIC BODIES, filed in the names of Emanuel M. Sachs and Ralf Jonczyk, on Dec. 1, 2010. Inventions disclosed herein are useful in conjunction with inventions disclosed in published PCT Application, which designated the United States, and has entered the national phase thereof, PCT App. No. PCT/US2010/026639, entitled METHODS AND APPARATI FOR MAKING THIN SEMICONDUCTOR BODIES FROM MOLTEN MATERIAL, in the names of Emanuel M. Sachs, Richard L. Wallace, Eerik T. Hantsoo, Adam M. Lorenz, G. D. Stephen Hudelson and Ralf Jonczyk, and 1366 Technologies Inc., published on Sep. 16, 2010 under No. WO2010/104838. The U.S. national phase of this application is of the same title, U.S. Ser. No. 12/999,206, published as US-2011-0247549-A1. The full disclosures of the Published PCT application and US Application (which are identical) are incorporated herein fully by reference. This prior disclosure and application is referred to below as the Direct Wafer application. A full copy of the PCT application as filed was also appended as an appendix to U.S. Provisional application No. 61/418,699, to which the present application claims priority, and was a part thereof.

The Direct Wafer application describes a method of making semiconductor bodies, for instance wafers for use as solar cells, directly from a melt of semiconductor material. The following discussion is taken in part from the Direct Wafer application, with some modifications. An aspect of a Direct Wafer process will first be discussed in a batch implementation, where a single semiconductor sheet is made at a time, as shown schematically with reference to FIGS. 1, 2 and 3A-3D. A semiconductor melt 13 may be contained in a crucible 11 made of graphite, silica, silicon carbide, silicon nitride and other materials capable of containing molten semiconductor, such as silicon. The processes disclosed herein are suitable for fabrication of many different types of semiconductor material. Silicon will be discussed as representative, but the inventions are not intended to be limited to use with only silicon.

As shown in FIG. 1 a vacuum plenum 1 is created, for example, by machining a cavity 3 into a block of graphite. A thin sheet 5 of, graphite or other suitable material, is affixed to the bottom of the plenum 1. This sheet preferably has a fair degree of gas permeability (having a high porosity and/or being relatively thin). The plenum is preferably the least porous graphite (or other suitable material) available. The plenum could also be made of non-porous ceramic. The thin sheet 5 will be referred to herein as the mold sheet. Vacuum suction is applied at port 7. Referring now to FIG. 3A, the assembly 8 is brought into contact with the surface 15 of melt 13. The assembly remains in contact with the melt for a designated period of time, perhaps on the order of 1 second. The amount of contact time between the assembly and the melt will vary depending on factors that include, but are not limited to: the temperature of the melt, the temperature of the mold sheet, the thickness of the mold sheet and the intended thickness of the silicon sheet to be fabricated. A silicon sheet freezes onto the mold sheet, as shown in FIG. 3B. The process is thus a transient heat transfer resulting in the silicon melt 13 being cooled to the melting point and then heat of fusion being extracted, resulting in the buildup 19 of solid silicon on the mold sheet. In general, at least a portion of the mold sheet should be at a temperature below the freezing point, for at least a portion of the time that the mold sheet contacts the molten material. Taking silicon as an example, the freezing/melting point is 1412° C.). Useful ranges for maintaining the mold sheet for use with silicon as the semiconductor might go from room temperature to any temperature below the freezing/melting point.

A principal purpose of the vacuum is to cause the formed silicon sheet 19 to be temporarily held against the mold sheet 5. It is helpful that the silicon sheet 19 be easily removed from the mold sheet 5 after the silicon sheet is formed. It is very helpful if the silicon sheet would simply fall off. However, it is very important that as the silicon sheet is being formed, it adhere to the mold sheet 5. The vacuum 17 accomplishes this goal. Without the vacuum, when the mold sheet is removed after being in contact with the molten silicon 13 for the appropriate length of time, the solidified silicon 19 would likely remain behind on the top 15 of the melt and then it would re-melt. Indeed, significant adhesion is needed to remove the solidified silicon sheet 19 from the melt 13 because the surface tension of the molten silicon is holding the silicon sheet 19 down.

After the designated period of time, the assembly 8 is lifted out of the melt 13, now carrying silicon sheet 19 attached to it, as shown in FIG. 3C. Finally, in FIG. 3D, the vacuum 17 is released and the formed silicon sheet 19 can be separated from the mold sheet 5. Upon release of the vacuum 17 the silicon sheet 19 may simply fall off. However, some small amount of residual adhesion may keep the sheet from falling off.

The graphite mold sheet 5 must have sufficient porosity to allow for suction sufficient to accomplish the goal of adhering to the silicon sheet 19. There are a very large variety of grades of graphite, ranging over a very large range of porosity. Thus there are many suitable choices.

The porosity of the mold sheet 5 must not be so great as to allow the molten silicon 13 to enter the pores, thereby making release of the silicon sheet 19 difficult or impossible. Two independent factors combine to prevent silicon from entering into fine pores. First, the surface tension of the molten silicon is too high to permit it to infiltrate fine pores (of a non-wetting material). Second, the silicon is beginning to freeze rapidly on contact to the mold sheet and this freezing would be especially fast in the high surface area to volume ratio situation presented by a fine pore. The second factor is present even for a wetted material.

The foregoing discussion relates to using a melt surface at approximately atmospheric pressure. It is also possible, and discussed in the Direct Wafer applications to use a melt surface at higher than atmospheric pressure.

The interface between the forming surface and the molten semiconductor and later, solidified wafer is very important. It is advantageous for this forming interface to separate cleanly upon reduction of the vacuum being applied through the mold sheet. Further, it is helpful if it allows for some slipping between the wafer and the mold sheet, especially as the wafer cools and shrinks differently than the mold sheet. It is also advantageous for the forming interface to allow for the growth of large grains by avoiding the rapid nucleation of a high multiplicity of grains. To accomplish this, the interface can be of a nature to allow under-cooling of the melt, while maintaining a low propensity to nucleate grains, for example, by providing at this interface a material with a low propensity to nucleate grains. Further, it is useful to control the heat transfer across this interface to exercise influence over the grain size formed in the semiconductor wafer. For example, reducing the heat flow across the interface can allow time for nucleated grains to grow laterally, thus resulting in larger grain sizes. The nature of this interface should be created and modified in a well-controlled manner so that successive wafers formed have similar properties. The nature of this forming interface should also be controlled in an economical manner that can be implemented in a realistic production environment

SUMMARY OF INVENTIONS

Method inventions disclosed herein employ a sheet referred to herein as an interposer sheet for use making semiconductor bodies, such as of silicon, such as for solar cell use. It is free-standing, very thin, flexible, porous and able to withstand the chemical and thermal environment of molten semiconductor, such as silicon, without significant degradation. It is typically of a ceramic material, such as silica, silicon nitride, silicon oxynitride, silicon oxycarbide, silicon carbide, silicon carbonitride, silicon oxycarbonitride and others, as discussed below. It is provided between the forming surface of a mold sheet, and the molten material from which a semiconductor body will be formed. It may be either secured to the head structure that carries the mold sheet with its forming surface or deposited upon the surface of the melt. The composition of the interposer sheet helps to suppress grain nucleation, leading to relatively large grain sizes. It also helps to limit heat flow from the melt, which controls the timing of solidification of the semiconductor body. It also promotes separation of the solidified semiconductor body from the forming surface. Because it is free standing, it can be fabricated before its use, and therefore, its properties can be tested and verified, leading to a high degree of reliability and reproducibility from one solidified body to the next. Also, using a free-standing interposer sheet permits greater control over the factors mentioned in this paragraph, than can be had with particulate, or other non-free-standing articles for achieving similar functions. An interposer sheet itself is also an invention hereof. Because it is free-standing and not adhered to the forming surface, problems of mismatch of coefficients of thermal expansion either are minimized or do not arise, because the interposer sheet and the solidified semiconductor body are free to expand and contract relatively independently of the forming surface. Further, the formed semiconductor body is relatively free to release from its association with the forming surface, because the interposer sheet prevents adherence of the semiconductor body to the forming surface.

BRIEF DESCRIPTION OF THE FIGURES OF THE DRAWING

FIGS. 3A, 3B, 3C and 3D are a schematic representation of known method steps using a plenum such as shown in FIG. 1, with:

FIG. 3A showing a refractory mold sheet contacting a melt surface;

FIG. 3B showing a body of semiconductor formed on the mold sheet;

FIG. 3C showing the plenum and mold sheet assembly removed from the melt; and

FIG. 3D showing the formed semiconductor body released from the mold sheet upon release of the vacuum in the plenum;

FIGS. 4A-4G show, schematically, a sequence of steps using an interposer sheet of an invention hereof, secured to a mold sheet, by clamping at its edges, as the mold sheet advances toward the molten material, with:

FIG. 4A showing an interposer sheet secured to a forming surface with its center hanging and spaced away from that of the forming surface;

FIG. 4B showing the interposer sheet first contacting the molten surface;

FIG. 4C showing the interposer sheet contacting the molten surface over the entire sheet area;

FIG. 4D showing the forming surface contacting the back surface of the interposer sheet, away from the molten surface;

FIG. 4E showing a semiconductor body forming on the interposer sheet;

FIG. 4F showing the mold sheet and forming surface lifted away from the molten material, carrying the solidified semiconductor body on the interposer sheet; and FIG. 4G showing the interposer sheet separated from the forming surface, still carrying the solidified semiconductor body;

FIGS. 5A-5D show, schematically, a sequence of steps using an interposer sheet of an invention hereof, secured to a mold sheet, by means not shown, for use with a crucible having one wall that is relatively lower than another wall, as the mold sheet advances toward the molten material, with:

FIG. 5A showing an interposer sheet secured to and contacting a forming surface substantially over its full extent;

FIG. 5B showing the interposer sheet first contacting the molten surface at a meniscus above the relatively lower wall;

FIG. 5C showing the interposer sheet and mold sheet advanced further along a direction of arrow M, with a significant extent of semiconductor solidified upon the interposer sheet; and FIG. 5D showing a fully formed semiconductor body upon the interposer sheet, and the crucible moved away from the mold sheet assembly;

FIGS. 6A-6C show, schematically digital images of photomicrographs, depicting a range of porosity and configuration of pores and solid grounds of an interposer sheet of an invention hereof, with:

FIG. 6A showing a least porous interposer sheet;

FIG. 6B showing a moderately porous interposer sheet;

FIG. 6C showing a more porous interposer sheet; and

DETAILED DESCRIPTION

Materials to achieve various functions, important to the forming interface, such as to reduce nucleation, control grain growth and to affect heat flow, among other functions, can be provided in the form of a free-standing sheet of suitable material, including, but not limited to: silica, silicon nitride, silicon oxynitride, silicon oxycarbide, silicon carbide, silicon carbonitride, silicon oxycarbonitride and others, and others. Others may include alumina, mullite, and boron nitride. In general, any ceramic that can withstand the temperatures without degrading may be used. Ceramics that contain materials that may be deleterious to formation of semiconductor bodies, such as alumina, mullite and boron nitride may be used, if the conditions are such that no significant amount of such deleterious material exits the ceramic and enters the semiconductor body. Such a sheet is referred to herein as an interposer sheet.

By free-standing, it is meant a body that is fabricated some time before its intended use, and is capable of being handled separately, without being secured to a larger or more massive or stiffer substrate. A free-standing body may have a relatively thin sheet on one or more surfaces, and may also carry upon one or more surfaces other incidental small elements, such as local coatings, seeds, etc.

Such an interposer sheet of material is fabricated in a separate operation, at an earlier time, and this interposer sheet is then used to make semiconductor bodies, such as wafers, by methods similar to those disclosed in the incorporated Direct Wafer patent application, but augmented with use of one or more interposer sheets, as discussed herein. Such sheets may be referred to herein as an interposer sheet, or in some cases, simply, as a sheet. A typical semiconductor body that may be formed with these methods is a wafer of silicon for use in solar cells. However, other semiconductors, and other bodies may also be formed.

Figure 4A:
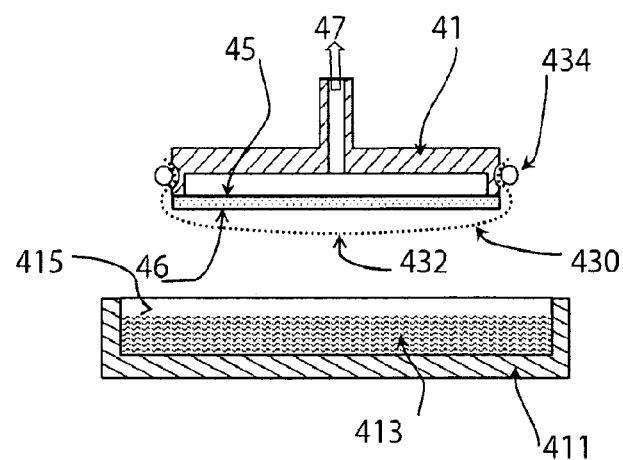

As shown in FIG. 4A an interposer sheet may be provided between the forming surface 46 of the mold sheet 45 and the surface 415 of the molten material 413. It may be provided secured to the mold sheet, as shown with reference to FIGS. 4A-4G, for an embodiment that is clamped, and hangs (as discussed below); or as shown in FIGS. 5A-5D, for an embodiment that is secured more tightly over its extent; or may be deposited upon the molten surface 415 (un-shown).

The interposer sheet is porous, to allow the pressure differential, such as a vacuum of the wafer forming method disclosed in the Direct Wafer patent application, to propagate through the interposer sheet to the molten silicon. The degree of porosity of the interposer sheet can vary widely from just 1 percent to as high as approximately 80%. The diameter of the openings can vary from a 1 micron to up to approximately 100 microns. Even an opening of as large as approximately 100 microns will not admit the molten silicon to contact the forming face 46 of the porous mold sheet 45. This is especially so because the materials used for an interposer sheet that is designed to provide for only minimal grain nucleation are also not well wetted by the molten silicon. It is advantageous that at least a moderate fraction of the porosity be open porosity, to allow the vacuum to be conducted through the mold sheet and the interposer sheet. It is also possible for all the porosity to be open. Some degree of closed cell porosity may be present.

Figure 6A:
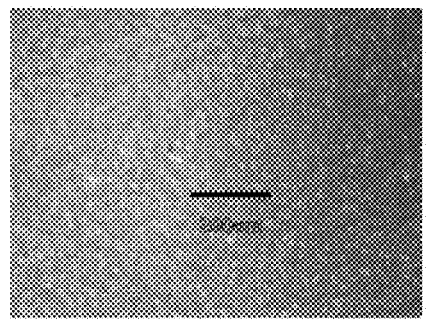
Figure 6B:
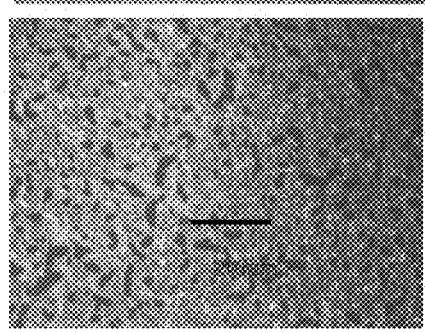
Figure 6C:
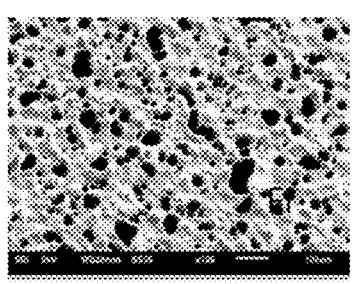

FIGS. 6A-6C illustrate a range of porosity and configurations of the pores and solid ground. FIG. 6A shows a relatively less porous interposer sheet, as compared to the others shown. FIG. 6B shows a moderately porous interposer sheet, and FIG. 6C shows a more porous interposer sheet.

In this document, when a sheet thickness is stated it will be the mass-equivalent sheet thickness, or ME thickness. That is, a porous sheet of ME thickness 5 microns has a mass equivalent to that of a 5 micron thick, fully dense sheet of the same area and made of the same material. For example, If the porosity of the sheet is 50%, and the ME thickness is 5 microns, then the thickness extent (from tallest peak on one surface to the tallest peak on the obverse surface) of the sheet is at least 10 microns. Typically, the free-standing interposer sheet has a ME thickness of between 1 and 10 microns, with a preferred range of 2 to 5 microns.

Preferably, the interposer sheet has a significant degree of flexibility, owing to its thin and porous nature. This flexibility facilitates handling and clamping of the interposer sheet and serves purposes using the interposer sheet, including allowing the interposer sheet to conform well to the forming surface of the mold sheet and the surface of the liquid melt and, in some modes, allowing the interposer sheet to take on a deliberate curvature as described below. In some embodiments, the sheet should be able to assume a radius of curvature as small as 2 mm. For instance, as shown in FIG. 4A, the clamp 434 secures an interposer sheet 430 that assumes a curvature having a radius of about 2 mm. In some cases, a minimum degree of flexibility is not critical. Due to the thinness of the interposer sheet for other purposes, it will inherently be thin enough to conform to the forming surface shape, or non-level regions of a molten surface. However, for some purposes, such as the clamping shown above, a high degree of flexibility may be important and very beneficial.

As shown schematically with reference to FIGS. 5A-5D, discussed more fully below, an interposer sheet 530 may be adhered to the porous mold sheet 55, for example, using the vacuum drawn through the porous mold sheet 55. Alternatively, as shown schematically with reference to FIGS. 4A-4C, an interposer sheet 430 may be supported from the mold sheet 45, or from the head 41 that holds the mold sheet 45, by clamping at its edges with clamps 434. Clamping and a secondary means of attachment, such as vacuum 47, may be used simultaneously. Depending on the selected ceramic material the interposer sheet could be electrically charged and that charge could be used to attach the interposer sheet to the forming surface of the mold sheet. Such electrostatic attachment of the interposer sheet to the mold sheet can also be accomplished by establishing a voltage on the mold sheet.

The mold sheet with an interposer sheet attached is lowered into the melt, vacuum is drawn and a semiconductor wafer sheet is solidified. The mold sheet and solidified semiconductor sheet can be removed from the melt in a variety of manners similar to those described in the Direct Wafer application, but augmented significantly by the presence of an interposer sheet. The vacuum can be initiated before the interposer sheet contacts the melt or after contacting the melt.

Figure 4B:
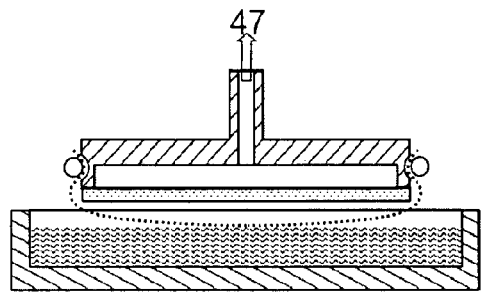
Figure 4C:
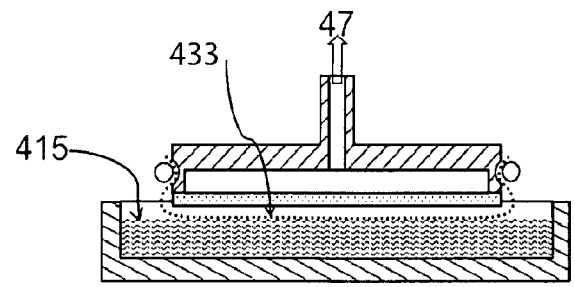
Figure 4D:
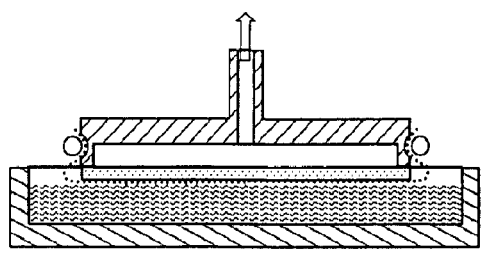

As shown with reference to FIG. 4A when the porous sheet 430 is supported from the mold sheet 45 by its edges, the interposer sheet 430 may be allowed to hang down. In this way, as shown in FIG. 4B, the free center 432 of the interposer sheet 430 initially contacts the surface 415 of the melt while free of the forming surface 46 of the porous mold sheet 45. The mold sheet 45 continues to descend and then as shown in FIGS. 4C and 4D, presses upon the back surface 433 of the interposer sheet 430, and then reaches the level of the surface 415 of the melt 413. This allows the interposer sheet 430 time to warm up and be wetted by the melt 413 before the contact of the forming surface 46 of the mold sheet 45 to the back surface 433 of the interposer sheet. For example with a porous mold sheet 45 of 160×160 mm, the interposer sheet 430 may be clamped at two edges such that the center 432 of the interposer sheet hangs down from the forming surface 46 by approximately 10 mm. This requires that the interposer sheet be able to assume a radius of curvature of about 325 mm or smaller. An interposer sheet that can assume a radius of curvature of approximately 150 mm can be handled with a wide variety of configurations. With an even higher degree of flexibility, such as being able to assume a curvature having a radius of about 2-3 mm, an interposer sheet can be clamped by a small diameter clamp such as shown at 434 in FIG. 4A-4G.

In another embodiment, not shown in a separate figure, the interposer sheet may be placed on the surface of the molten silicon independent of the mold sheet and sufficient time allowed for the interposer sheet to be wetted (typically a few seconds). The mechanism that can place the interposer sheet can be similar to that shown in FIG. 4A at 434, except that the mating element of the clamp 434 is not the head 41 that holds the mold sheet 46. Rather, it can be a separate element, typically part of a larger frame, having an open region large enough for the entire head 41 and mold sheet 46 assembly to fit through the opening to contact the back side 433 of the interposer sheet 430, once deposited upon the molten surface 415. But the mechanical function would be the same namely to mate with the clamp 434 to hold the interposer sheet 430 as it is brought near to the surface of the melt, and then contacts the melt, and also optionally to secure it in position while on the melt. The porous forming surface can then be lowered down onto the wetted interposer sheet, through the opening in the frame, and then all can be drawn away from the melt together. It has been found that pre-wetting of the interposer sheet can result in larger grain sizes, as is desirable.

Other apparatus and methods of placing the interposer sheet upon the melt before the forming surface contacts the back of the interposer sheet can be used. It will likely be important to have a mechanism that can release the interposer sheet from its grasp, and then ensure that the deposited interposer sheet either remains in a position or undergoes controlled motion so that the mold sheet can be reliably brought to bear upon it. The interposer sheet can be applied to the melt so that it first contacts the melt at a region near its center, such as shown at 432 of FIG. 4B, which is a generally a line. The contact region may be a line, such as parallel to an edge or diagonal of the sheet, or a very small region.

Whether the interposer sheet is deposited by a dedicated purpose depositing device, or as clamped to the head 41 that also holds the mold sheet 45, one method of making wafers using an interposer sheet is to place the interposer sheet on the melt surface between approximately 0.1 s and approximately 5 s before the forming surface engages the back surface of the interposer sheet, facing away from the melt.

Figure 4E:
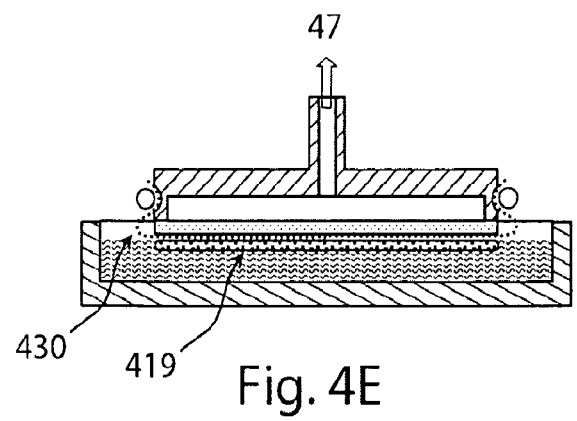

As shown in FIG. 4E, the forming surface 46 is under vacuum 47 or differential pressure less than that of the melt surface and, nucleates a relatively low number of grains in the under-cooled silicon 434 contacting the interposer sheet 430. (An under-cooled liquid remains liquid even at a temperature that is below its melting temperature.) Depending on subsequent dwell-time in the melt, the forming surface temperature, vacuum level and mold sheet thermal properties, a semiconductor body 419, such as a wafer of desired thickness with large grains (up to 10 mm have been observed) is grown.

Figure 4F:
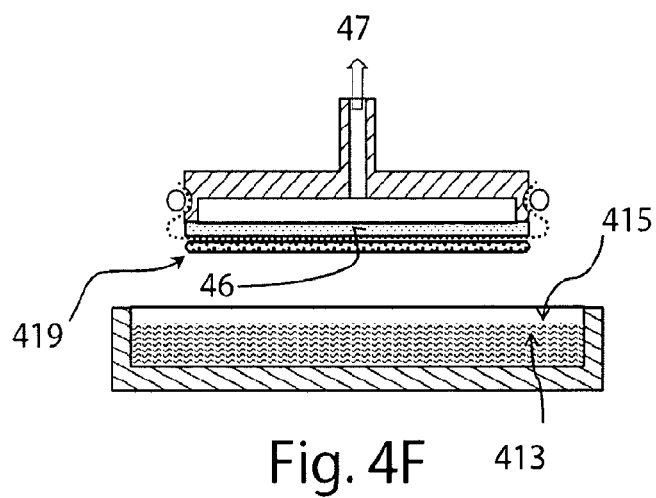

It is then, as shown in FIG. 4F, removed from the melt 413. Aspect ratios of up to 50:1 for grain size and thickness have been observed with the grain size 50 times the thickness of the wafer. The wafer is coupled to the mold sheet forming surface 46 with the interposer sheet 430 interposed between the two, by a vacuum 47. There is little to no chemical or mechanical interaction of the formed wafer body 419 with the forming surface 46. They are not contacting each other.

Figure 4G:
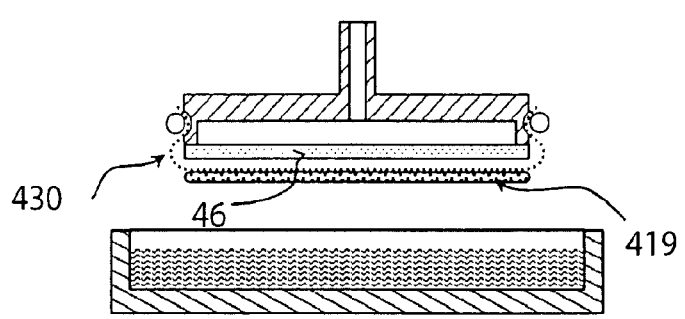

As shown in FIG. 4G, the interposer sheet 430 is moved away from and becomes separated from the forming surface 46, with the formed semiconductor body 419 still associated with the interposer sheet 430, by reducing or removing the vacuum pressure 47. The interposer sheet 430 is then separated from the solidified body 419, as discussed below, typically in a separate, later process.

Another arrangement for using an interposer sheet is shown schematically with reference to FIGS. 5A-5D. A crucible, 511 has at least one side that is relatively lower 542 than the others. The molten material is provided to a depth such that a meniscus 515 resides above the level of the lower wall 542. The lower wall may extend across the entire width of the crucible (in a dimension into the page), or it may occupy only a partial region of such a width, with higher wall portions at the corners. The walls of the crucible not shown, due to the section, may be slanted, from low at the corner with the lower wall 542, or may be fully higher. The mold sheet 55 is part of a head assembly 51, which can be moved in the direction of the arrow M (to the left as shown) toward and along the crucible 511. An interposer sheet 530 is secured to the forming surface of the mold sheet 55 by means not shown, but also including suction action from a differential pressure 57, such as a vacuum, as discussed above. As the head assembly 51 is moved in the direction of the arrow M, the crucible 511 may typically be moved to meet it, in the direction of the arrow C. This mutual motion helps to minimize irregularities in the formed wafer at the location of initial contact.

Figure 5D:
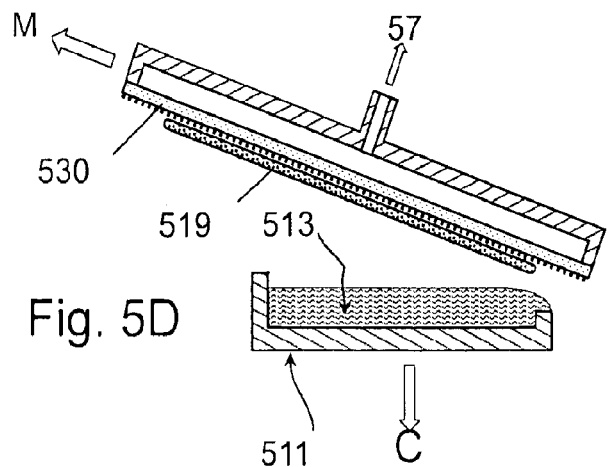
Figure 5C:
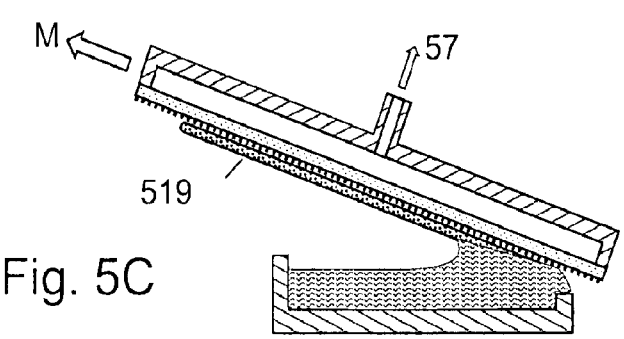
Figure 5B:
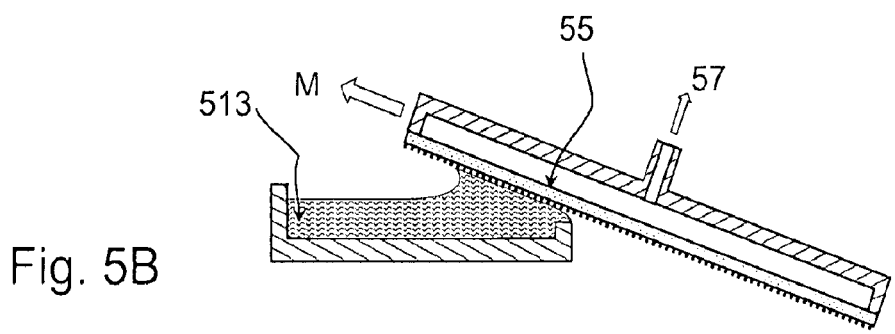

FIG. 5B shows, schematically the molten liquid 513 being drawn toward the mold sheet 55, and also along in the direction of the arrow M. The molten material directly contacts the interposer sheet 530, and does not contact the mold sheet 55, similar to as discussed above in connection with the embodiment discussed with reference to FIGS. 4A-4G.

FIG. 5C shows the situation a short while later, with a solidified semiconductor body 519 forming upon the interposer sheet 530. The mold sheet 55 is relatively cooler than the molten material, again in the same manner as discussed below, thus nucleation of grains is initiated.

FIG. 5D shows the situation another short while later, where a fully formed body 519 is attached to the interposer sheet 530. The crucible 511 has been moved in the direction of arrow C of FIG. 5D (downward, as shown), away from the semiconductor body, while the head assembly 51 continues to move in the direction of the arrow M. Thus, the semiconductor body has detached from the molten material 513. This mutual motion helps to minimize irregularities in the formed wafer at the location of final contact.

The interposer sheet and formed semiconductor body can then be removed from the mold sheet 55 by cessation of the vacuum 57, and other means, as discussed above. The interposer sheet can then be removed from any adherence to the formed semiconductor body, such as by etching or other means, also as discussed.

Figure 5A:
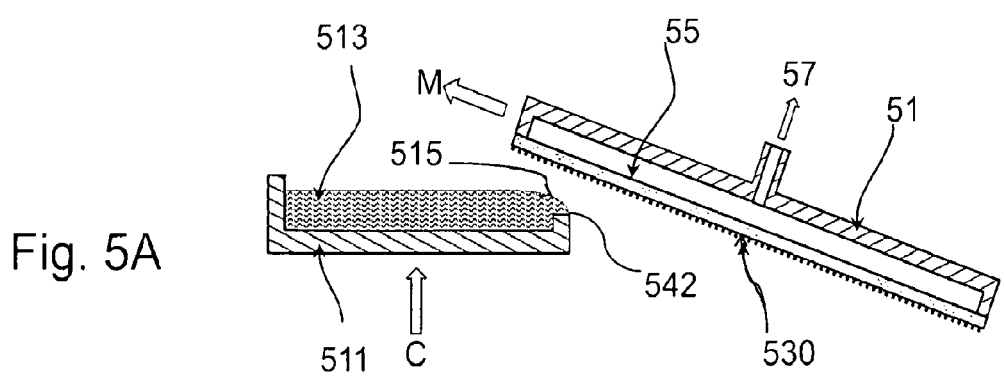

A crucible such as shown in FIG. 5A can be used in a method to make semiconductor bodies, such as is shown and discussed in the Direct Wafer patent application, without using an interposer sheet. It can be used in a similar manner as the crucibles shown in FIGS. 4A and 5A of the Direct Wafer application.

It is also possible to present an interposer sheet vertically into a crucible, similar to that shown with reference to FIGS. 4A-4G, but rather than allowing the interposer sheet to hang from the mold sheet, it may be held more tightly to the forming surface, 46, similar to the arrangement shown in FIG. 5A, in which the interposer sheet 530 is held face to face tightly to the forming surface of the mold sheet 55.

The interposer sheet has been found to result in dramatically increased grain size of the formed silicon wafer body, as compared to a process that uses a forming surface composed predominantly of a material such as graphite or SiC, which are suitable for other purposes, but are highly nucleating. Grains of average size greater than 1 mm, with largest grains up to approximately 5 mm can be routinely produced by this method. The interposer sheet does not promote, and in some cases, suppresses nucleating. This allows for sub-cooling of the melt without nucleation.

Another key advantage of the use of such an interposer sheet is that the interposer sheet provides a very clean release from the mold sheet forming surface. Basically, for use in an interposer sheet, any materials that do not react with or bond to the forming surface to any substantial degree over the contact duration, can be used to help cleanly release the formed semiconductor body from the forming surface. $SiO_2$ and $Si_3N_4$ have been used in interposer sheets with a graphite forming surface with good results. It is believed that many high temperature refractory materials will work relatively well, as long as they prevent molten semiconductor material, such as silicon, from reaching the forming sheet.

Typically, it is expected that an individual interposer sheet will be used just once. In some cases it has been found possible to just peel off the interposer sheet from the formed semiconductor body. Because the interposer sheet is so thin, often it can be peeled off without placing undue mechanical stress upon the semiconductor body. In other cases, the interposer sheet can be removed from the formed semiconductor body by chemical etching, preferably using an etchant that does not attack the underlying semiconductor body. The single use nature of the interposer sheet provides an avenue for excellent process control, as each formed wafer experiences the same forming cycle and does not differ from previous formed wafers due to aging of the interposer sheet. However, it may also be possible to use a given individual interposer sheet to make several wafers.

An interposer sheet can also be used in other embodiments similar to those described in the incorporated Direct Wafer application, but significantly augmented with use of an interposer sheet. For example, an interposer sheet may be used in the vertical embodiments described in reference to FIGS. 22A and 22B thereof.

Another advantage of the use of such an interposer sheet is that it can provide a controlled amount of resistance to heat flow from the molten silicon to the mold sheet, helping to exercise control over grain size. In general, a lesser flow of heat will result in relatively larger grain sizes. The degree of resistance to heat flow can be changed by the thickness, composition and roughness of the interposer sheet. Relatively thicker interposer sheets provide more resistance to heat flow than would a relatively thinner sheet. Relatively higher porosity provides relatively more resistance to heat flow than would a less porous body. Roughness of the interposer sheet surfaces may also be used to control heat flow.

Another advantage of using an interposer sheet is that by preventing a chemical reaction between the molten silicon and the forming surface, adhesion of the solidified wafer to the forming surface is prevented. Thus, the interface between the solidified wafer with interposer sheet attached and the forming surface is free to slip. As the formed wafer and forming surface cool, there is differential shrinkage between the formed wafer and the forming surface. The interposer sheet allows slippage between the formed wafer and the forming surface, which prevents these different shrinkages from imposing large stresses on the cooling wafer. In this way, the formation of dislocations and the introduction of stresses into the wafer are minimized.

A single interposer sheet made of a single material may convey several of the advantages described above. For example, a single sheet of fused $SiO_2$ may impede, and thus control heat transfer, permit slippage and provide clean release. However, it may be advantageous to blend two or more materials in a single interposer sheet, to more fully benefit from the various advantages of an interposer sheet. For example, a mixture of silicon nitride and silica powders within a single interposer sheet has been found useful. $SiO_2$ allows semiconductor body formation and provides some degree of nucleation suppression. $Si_3N_4$ limits oxygen contamination of the formed wafer body.

Figure 7:
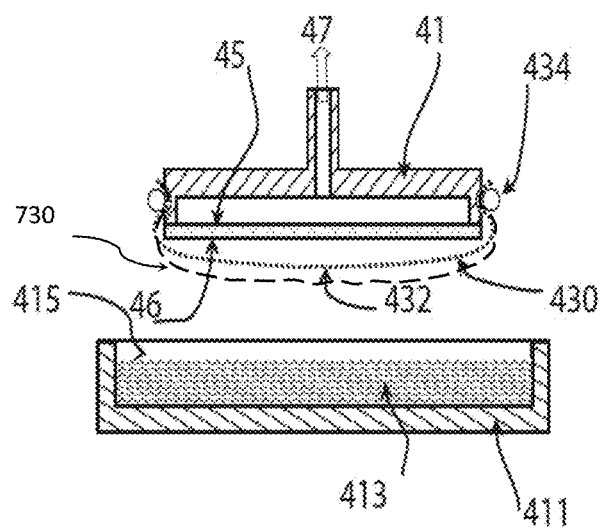
FIG. 7 shows, schematically, one of a sequence of steps similar to that shown in FIG. 4A, but using an additional interposer sheet, for a total of two interposer sheets of an invention hereof, secured to a mold sheet, by clamping at their edges, as the mold sheet advances toward the molten material, with FIG. 7 showing a step analogous to that shown in FIG. 4A, showing two interposer sheets secured to a forming surface with their centers hanging and spaced away from that of the forming

In another embodiment of a method invention hereof, shown schematically in FIG. 7, two or more interposer sheets 430 and 730 can be stacked, with each interposer sheet being of the same composition or of different compositions. Stacking two or more interposer sheets is particularly useful in guaranteeing clean release, for example. For instance, a predominantly $SiO_2$ interposer sheet 730 may be provided facing the molten semiconductor material, and an adjacent interposer sheet 430, facing the forming surface, may be composed predominantly of $Si_3N_4$. These two materials do not adhere very strongly to each other, and thus, separation of the stack between the two can be relatively easily achieved. Another advantageous use of multiple sheets is to use one sheet primarily to control nucleation properties and the other sheet primarily to control (by retarding) heat transfer. For instance, one interposer sheet may have a resistance to heat transfer that is relatively larger than that of at least one other interposer sheet. Similarly, one interposer sheet may have a nucleation propensity that is relatively smaller than that of at least one other interposer sheet. Use of two or more interposer sheets also provides at least one additional interface at which can arise slippage of the bodies adjacent to the interface, which slippage can be used to minimize deleterious effects of CTE mismatch.

Figure 1:
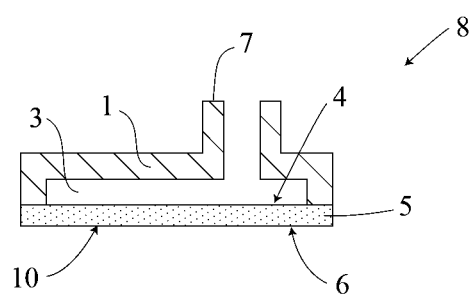
FIG. 1 is a schematic representation of a known plenum and refractory mold sheet for use with inventions hereof.
Figure 2:
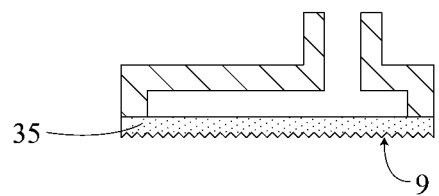
FIG. 2 is a schematic representation of such a known plenum with a refractory mold sheet 35 having a textured surface 9.
Figure 3A:
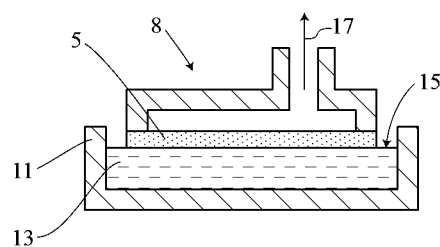
Figure 3B:
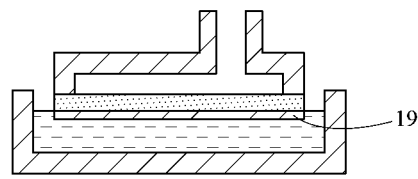
Figure 3C:
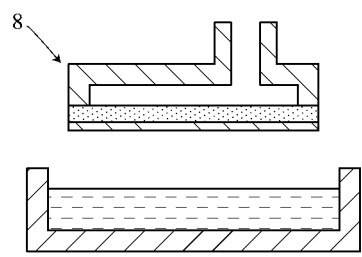
Figure 3D:
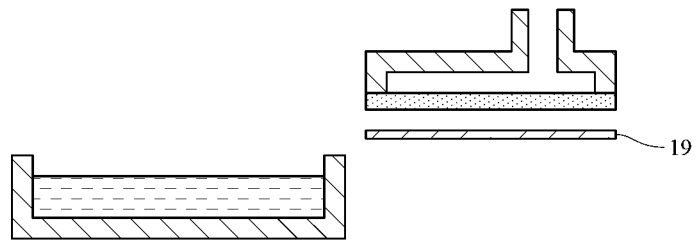

In some cases, as shown with reference to FIG. 2, a mold sheet 35 may have a textured forming surface 9. It is possible to use an interposer sheet with a textured surface. One method to do so is to provide an interposer sheet that itself assumes the same textured shape as the textured surface. For instance, for use with the grooved forming surface 9, the interposer sheet could be provided in a corrugated shape that mates with the grooves. Such shaped interposer sheets can be used with any of the embodiments shown, such as presenting an interposer sheet vertically into a crucible, as shown with reference to FIGS. 4A-4G, or to a crucible with one lower wall, as shown with reference to FIGS. 5A-D.

A representative method of fabricating an interposer sheet is to begin with fine particles of the desired material and use a layer creation or deposition method known in the unrelated arts of ceramic processing, to make a thin layer that is subsequently fired at high temperature to produce a free-standing body. Such methods include spraying onto a substrate, tape casting, and slip casting. Such techniques are not generally known within the art of fabricating semiconductor bodies. The particles may be spherical, equiaxed or platelet in shape. For some purposes, it may be advantageous to use needle-like particles. The layer deposition technique can consist of creating a slurry of the particles in water or organic solvent and spraying, slip casting, or doctor-blading the slurry on a substrate according to methods known in the ceramics processing arts. The slurry may have dispersants and fugitive rheology modifiers as known in the art. Shaped interposer sheets, as discussed above for use in connection with a textured forming surface 9, such as shown with reference to FIG. 2, may be fabricated by spraying and slip casting.

Using needle shaped particles results in less shrinkage of the interposer sheet as it is being fabricated, which makes it easier to maintain tolerances. Another advantage of an interposer sheet made of needle shaped particles, is that during use in contact with molten semiconductor material and subsequent cooling down, there is relatively less shrinkage than occurs with particles of other shapes.

Typically, an interposer sheet is composed of particles that have been fused or sintered to each other.

To summarize desirable properties of an interposer sheet, it should then, be porous to an appropriate degree, to allow sufficient gas flow to be passed through. It should be sufficiently durable to be free-standing; somewhat flexible (to enhance handling, clamping, hanging, and conforming to non-flat surfaces of the mold sheet and molten surface); chemically relatively inert over the duration of contact with respect to the molten material to such a degree that no more than an acceptable amount of impurities from the interposer sheet enter the molten material; thermally stable (refractory) to a degree sufficient to resist degradation under the heat and chemical environments of molten semiconductor, for instance silicon. It should also help to suppress nucleation, by impeding heat flow, and, perhaps by other means. It should also be possible to remove the interposer sheet from the formed semiconductor body, either by chemical or mechanical means. It should be able to retain these properties at the relatively high temperatures of molten semiconductor, such as silicon. Typically, for use with silicon the interposer sheet should be able to withstand approximately 1400° C. and should have fewer than 5 ppmw transition metals.

To reiterate what has been said above, suitable materials include but are not limited to silica, silicon nitride, silicon oxynitride, silicon oxycarbide, silicon carbide, silicon carbonitride, silicon oxycarbonitride and others. Others may include alumina, mullite, and boron nitride or boron containing ceramics. In general, any ceramic that can withstand the temperatures without degrading may be used. Ceramics that contain materials that may be deleterious to formation of semiconductor bodies, such as alumina, mullite and boron nitride may be used, if the conditions are such that no significant amount of such deleterious material enters the semiconductor body.

Silicon nitride is an attractive material from which to make an interposer sheet. It may be advantageous to provide silicon nitride with some silica to help bind the material. However, a composite of silicon nitride and a silicon oxide (such as Silicon oxide or silicon dioxide) is also useful.

While particular embodiments have been shown and described, it will be understood by those skilled in the art that various changes and modifications may be made without departing from the disclosure in its broader aspects. It is intended that all matter contained in the above description and shown in the accompanying drawings shall be interpreted as illustrative and not in a limiting sense.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

ASPECTS OF INVENTIONS

The following aspects of inventions hereof are intended to be described herein, and this section is to ensure that they are mentioned. They are styled as aspects, and although they appear similar to claims, they are not claims. However, at some point in the future, the applicants reserve the right to claim any and all of these aspects in this and any related applications.

A1. A method for fabricating a semi-conductor body, the method comprising the steps of:

a. providing a molten semi-conductor material, having a surface;

b. providing a porous mold, comprising a forming surface;

c. providing a free-standing ceramic sheet between the forming surface and the molten material;

d. contacting the forming surface to the ceramic sheet and the ceramic sheet to the surface of the molten material for a contact duration, such that a body of semi-conductor material, solidifies upon the ceramic sheet; and e. removing the solidified body from contact with the molten semi-conductor material while still contacting the ceramic sheet.

A2. The method of aspect A1, the semiconductor material comprising silicon.

A3. The method of aspect A2, the silicon body comprising a solar cell element.

A4. The method of aspect A1, further comprising: providing a differential pressure regime such that pressure at at least a portion of the forming surface is less than pressure at the molten material surface, such that, for at least a portion of the contact duration, the differential pressure regime exists.

A5. The method of aspect A1, further comprising the step of providing at least a portion of the forming surface at a temperature below a melting point of the semiconductor material for at least a portion of the contact duration.

A6.7. The method of aspect A4, further comprising the step of reducing the degree of the differential pressure regime, thereby contributing to detaching from the forming surface at least one of the ceramic sheet and the solidified body.

A7. The method of aspect A1, the step of providing the ceramic sheet comprising providing the ceramic sheet upon the molten material.

A8. The method of aspect A1, the step of providing the ceramic sheet comprising providing the ceramic sheet upon the forming surface.

A9. The method of aspect A8, further comprising the step of clamping the ceramic sheet to the forming surface.

A10. The method of aspect A9, further comprising the step of providing at least one additional ceramic sheet between the forming surface and the molten material.

A11. The method of aspect A9, the step of clamping the ceramic sheet comprising clamping the ceramic sheet such that the ceramic sheet hangs away from the forming surface such that the ceramic sheet contacts the molten material at a contact location and afterwards, the forming surface contacts the ceramic sheet obverse of the contact location.

A12. The method of aspect A11, the contact location comprising the center of the ceramic sheet.

A13. The method of aspect A10, two of the at least two ceramic sheets having different compositions from each other.

A14. The method of aspect A10, at least two adjacent ceramic sheets being composed of materials that do not adhere strongly to each other.

A15. The method of aspect A13, at least one ceramic sheet having a nucleation propensity that is relatively lower than at least one other ceramic sheet.

A16. The method of aspect A13, at least one ceramic sheet having a resistance to heat transfer that is relatively larger than that of at least one other ceramic sheet.

A17. The method of aspect A8, further comprising the step of securing the ceramic sheet to the forming surface by providing a differential pressure regime such that pressure at at least a portion of the forming surface is less than pressure at a face of the ceramic sheet facing away from the forming surface.

A18. The method of aspect A1, the ceramic sheet comprising a porous sheet.

A19. The method of aspect A1, the ceramic sheet being selected from the group consisting of: silica, silicon nitride, silicon oxynitride, silicon oxycarbide, silicon carbide, silicon carbonitride and silicon oxycarbonitride.

A20. The method of aspect A1, the ceramic sheet having a mass equivalent thickness of between approximately 1 and approximately 15 microns.

A21. The method of aspect A1, the ceramic sheet having a mass equivalent thickness between approximately 2 and approximately 5 microns.

A22. The method of aspect A1, the ceramic sheet being flexible.

A23. The method of aspect A22, the flexibility of the ceramic sheet being characterized by an ability of the sheet to be curved to a radius of less than approximately 325 mm and preferably of less than approximately 150 mm, and most preferably of less than 2 mm, without developing any fracture.

A24. The method of aspect A1, the ceramic sheet being porous.

A25. The method of aspect A24, the degree of porosity being from approximately 1 percent to as high as approximately 80%.

A26. The method of aspect A24, the ceramic sheet having openings having a diameter of between approximately 1 microns and approximately 100 microns.

A27. The method of aspect A1, further comprising the step of electrically charging the ceramic sheet relative to the forming surface, and attaching the ceramic sheet to the forming surface by establishing a voltage on the forming surface.

A28. The method of aspect A1, the ceramic sheet having less than approximately 5 ppmw of transition metals.

A29. The method of aspect A1, the ceramic sheet being capable to withstand a temperature of at least approximately 1400° C. without degradation for a contact duration sufficient for solidification of a silicon semiconductor body.

A30. The method of aspect A1, the ceramic sheet comprising fused material.

A31. The method of aspect A1, the ceramic sheet comprising sintered material.

A32. The method of aspect A30, the fused material fused from needle-shaped particles.

A33. The method of aspect A30, the fused material fused from equiaxed particles.

A34. The method of aspect A1, the material of the ceramic sheet having a lower potential to nucleate grains of the semiconductor than the material of the forming surface.

B1. A free-standing porous ceramic body comprising an interconnected network of a material, having a ME thickness of less than 10 microns and a first surface and an obverse surface, the solid material being able to withstand contact with a molten semiconductor at at least about 1400° C. for a contact duration sufficient to form a semiconductor body and having less than about 5 ppmw transition metals.

B2. The body of aspect B1, the network of material defining openings having a diameter of between approximately 1 microns and about 100 microns.

B3. The body of aspect B1, the network of material having a porosity of between approximately 1% and approximately 80%.

B4. The body of aspect B1, the material being selected from the group consisting of: silica, silicon nitride, silicon oxynitride, silicon oxycarbide, silicon carbide, silicon carbonitride, silicon oxycarbonitride, alumina, mullite and boron nitride.

B5. The body of aspect B1, the material having a lower propensity to nucleate grains of semiconductor material than graphite.

B6. The body of aspect B1, further comprising a second such body, the first and second bodies being composed of bodies that do not adhere strongly to each other.

C1. An assembly comprising:
  a. a porous mold, comprising a forming surface;
  b. a free-standing porous refractory ceramic sheet having a first and second surface, being secured at the first surface to the forming surface of the mold;
  c. secured to the second surface of the ceramic sheet, a semiconductor body formed directly from a molten quantity of semiconductor material.

C2. The assembly of aspect C1, further comprising a second ceramic sheet between and secured to each of the first ceramic sheet and the forming surface.

C3. The assembly of aspect C2, the first and second ceramic sheets having compositions that differ from each other.

D1. An apparatus for fabricating a semiconductor body from a molten supply of semiconductor material, the apparatus comprising:
  a. a porous mold, comprising a forming surface;
  b. a holding mechanism configured to hold a free-standing ceramic sheet facing the forming surface, such that the ceramic sheet hangs away from the forming surface such that the ceramic sheet can contact a surface of molten material at a contact location and such that the forming surface can be brought to contact the ceramic sheet obverse of the contact location; and c. a structure configured to provide a differential pressure regime such that pressure at the contact location is less than pressure at the surface of molten material.

Having described the invention, what is claimed is:

1. A method for fabricating a semiconductor body, the method comprising the steps of:
   a. providing a molten semiconductor material having a surface;
   b. providing a porous mold comprising a forming surface;
   c. providing a free-standing ceramic sheet upon the forming surface between the forming surface and the molten semiconductor material;
   d. clamping the free-standing ceramic sheet to the forming surface;
   e. contacting the forming surface to the free-standing ceramic sheet and the free-standing ceramic sheet to the surface of the molten semiconductor material for a contact duration such that a body of semiconductor material solidifies upon the free-standing ceramic sheet; and
   f. removing the solidified body from contact with the molten semiconductor material while still contacting the free-standing ceramic sheet.

2. The method of claim 1, further comprising providing at least one additional free-standing ceramic sheet between the forming surface and the molten semiconductor material.

3. The method of claim 1, wherein clamping the free-standing ceramic sheet comprises clamping the free-standing ceramic sheet such that the free-standing ceramic sheet hangs away from the forming surface such that the free-standing ceramic sheet contacts the molten semiconductor material at a contact location and afterwards, the forming surface contacts the free-standing ceramic sheet obverse of the contact location.

4. The method of claim 2, wherein the free-standing ceramic sheet and at least one additional free-standing ceramic sheet have different compositions from each other.

5. The method of claim 2, wherein at least two adjacent free-standing ceramic sheets are composed of materials that do not adhere strongly to each other.

6. A method for fabricating a semiconductor body, the method comprising the steps of:
   a. providing a molten semiconductor material having a surface;
   b. providing a porous mold comprising a forming surface;
   c. providing a free-standing flexible ceramic sheet between the forming surface and the molten semiconductor material, the flexibility of the free-standing ceramic sheet being characterized by an ability of the free-standing ceramic sheet to be curved to a radius of less than approximately 325 mm without developing any fracture;
   d. contacting the forming surface to the free-standing ceramic sheet and the free-standing ceramic sheet to the surface of the molten semiconductor material for a contact duration such that a body of semiconductor material solidifies upon the free-standing ceramic sheet; and
   e. removing the solidified body from contact with the molten semiconductor material while still contacting the free-standing ceramic sheet.

7. The method of claim 6, wherein the flexibility of the free-standing ceramic sheet is characterized by an ability of the free-standing ceramic sheet to be curved to a radius of less than approximately 150 mm.

8. The method of claim 6, wherein the flexibility of the free-standing ceramic sheet is characterized by an ability of the free-standing ceramic sheet to be curved to a radius of less than approximately 2 mm.

9. A method for fabricating a semiconductor body, the method comprising the steps of:
   a. providing a molten semiconductor material having a surface;
   b. providing a porous mold comprising a forming surface;
   c. providing a free-standing ceramic sheet between the forming surface and the molten semiconductor material;
   d. contacting the forming surface to the free-standing ceramic sheet and the free-standing ceramic sheet to the surface of the molten semiconductor material for a contact duration such that a body of semiconductor material solidifies upon the free-standing ceramic sheet; and
   e. removing the solidified body of semiconductor material from contact with the molten semiconductor material while still contacting the free-standing ceramic sheet.

10. The method of claim 9, wherein the free-standing ceramic sheet has openings having a diameter of between approximately 1 micron and approximately 100 microns.

11. The method of claim 9, wherein the degree of porosity of the free-standing ceramic sheet is from 1% to 80%.

12. A method for fabricating a semiconductor body, the method comprising the steps of:
   a. providing a molten semiconductor material having a surface;
   b. providing a porous mold comprising a forming surface;
   c. providing a free-standing ceramic sheet comprising fused material between the forming surface and the molten semiconductor material;
   d. contacting the forming surface to the free-standing ceramic sheet and the free-standing ceramic sheet to the surface of the molten semiconductor material for a contact duration such that a body of semiconductor material solidifies upon the free-standing ceramic sheet; and
   e. removing the solidified body from contact with the molten semiconductor material while still contacting the free-standing ceramic sheet.

13. The method of claim 12, wherein the fused material has been fused from needle-shaped particles.

14. A method for fabricating a semiconductor body, the method comprising the steps of:
   a. providing a molten semiconductor material, having a surface;
   b. providing a porous mold comprising a forming surface comprising a forming surface material having a potential to nucleate grains of a crystal solidified from the molten semiconductor material;
   c. providing a free-standing ceramic sheet between the forming surface and the molten semiconductor material the free-standing ceramic sheet comprising a material having a potential to nucleate grains of a crystal solidified from the molten semiconductor material, wherein the free-standing ceramic sheet material's potential to nucleate grains is lower than the forming surface material's potential to nucleate grains of a crystal solidified from the molten semiconductor material;
   d. contacting the forming surface to the free-standing ceramic sheet and the free-standing ceramic sheet to the surface of the molten semiconductor material for a contact duration such that a body of semiconductor material solidifies upon the free-standing ceramic sheet; and
   e. removing the solidified body from contact with the molten semiconductor material while still contacting the free-standing ceramic sheet.

* * * * *